United States Patent
Huang

(10) Patent No.: US 8,698,507 B2
(45) Date of Patent: Apr. 15, 2014

(54) DC CAPACITOR DEGRADATION ALARM CIRCUIT

(75) Inventor: Jui-Kun Huang, Kaohsiung (TW)

(73) Assignee: Eneraiser Technology Co., Ltd., Kaohsiung (TW)

( * ) Notice: Subject to any disclaimer, the term of this patent is extended or adjusted under 35 U.S.C. 154(b) by 595 days.

(21) Appl. No.: 12/974,929

(22) Filed: Dec. 21, 2010

(65) Prior Publication Data

US 2012/0153965 A1    Jun. 21, 2012

(51) Int. Cl.
*G01R 31/00* (2006.01)
*G01R 31/02* (2006.01)
*G01R 31/01* (2006.01)

(52) U.S. Cl.
CPC ............ *G01R 31/028* (2013.01); *G01R 31/016* (2013.01)
USPC .......................................................... 324/548

(58) Field of Classification Search
CPC ........................... G01R 31/028; G01R 31/016
USPC ........................................................... 324/548
See application file for complete search history.

(56) References Cited

U.S. PATENT DOCUMENTS

| | | | |
|---|---|---|---|
| 4,401,942 A * | 8/1983 | Renz .............................. | 324/679 |
| 7,830,269 B2 * | 11/2010 | Cheng et al. .................. | 340/635 |
| 2007/0211501 A1 * | 9/2007 | Zargari et al. .................. | 363/39 |
| 2011/0292696 A1 * | 12/2011 | Xiao et al. ....................... | 363/37 |

* cited by examiner

*Primary Examiner* — Jeff Natalini
(74) *Attorney, Agent, or Firm* — Muncy, Geissler, Olds & Lowe, P.C.

(57) ABSTRACT

A DC capacitor degradation alarm circuit is a capacitor degradation detection device including two filter circuits and a degradation detection element. The two filter circuits, which receive a rectified voltage and perform filtering operation, are coupled in parallel and include a plurality of capacitor modules coupled in series. Each capacitor module can be a single capacitor or includes a plurality of capacitors coupled in series or parallel to allow users to arrange construction thereof to receive required capacitance. The degradation detection element electrically bridges the two filter circuits with connection nodes located between the capacitor modules to instantly detect a voltage difference value of the two filter circuits online and perform operation by incorporating with total output voltage to get voltage difference value percentage. In the event that the obtained percentage exceeds a preset range, the degradation detection element automatically generates a capacitor degradation alarm signal to alert users.

5 Claims, 6 Drawing Sheets

DC CAPACITOR DEGRADATION ALARM CIRCUIT

FIELD OF THE INVENTION

The present invention relates to a DC capacitor degradation alarm circuit and particularly to a circuit which can automatically detect capacitor degradation while a DC power supply system is in operation, and provide an alarm signal through a voltage difference value generated by the degradation.

BACKGROUND OF THE INVENTION

In a conventional DC power supply, the electrolytic capacitors are commonly used as the energy storage and filter capacitors because the electrolytic capacitors have greater capacitance than other types of dielectrics (such as ceramic, mica, glass, paper, oil or the like), but they also have shortcomings, such as undesirable frequency and temperature characteristics, shorter lifespan, and greater leakage current. When terminal voltage is greater than specification of the capacitor, electrolytic solution would be gasified and then blasted. Depletion of the electrolytic solution also causes attenuation and degradation of the capacitors. Their utilization is constrained in application fields where higher reliability is required for a prolonged duration. The conventional design of power supply generally adopts a plurality of electrolytic capacitors coupled in parallel to get greater capacitance, but such a design causes maintenance problem in practice.

The reliability for power supply systems and charging equipment is always one of the important issues in electric power quality. During the DC power supply system being in operation, capacitor degradation could cause unstable power supply and power interruption that result in production shut down of petrochemical or nuclear power plants, paralysis of financial markets (such as computer crash in financial transaction market), chaos of public transportation systems, and even risk people's life and threaten financial conditions and environments.

Moreover, capacitor degradation also reduces filtering effect and increase voltage ripple at the DC side to further damage energy storage device. The energy storage device is expensive and very important in an Uninterruptable Power System (UPS). In order to protect the energy storage device, the priority is to take care of the capacitors. In recent years, rapid advances of technology have spawned myriad of electronic instruments and precision equipment, thus stability of UPS becomes even more important. During operation of UPS, detection of capacitor degradation is performed by first switching the power supply to other power source and making the UPS in an OFF condition, or detection has to be regularly implemented. All these cannot automatically perform capacitor degradation alarm. How to detect capacitor degradation while the DC power supply system is in normal operation without affecting load apparatus at the output side of the UPS is an issue not yet fully resolved and still a goal pursued by the present invention.

SUMMARY OF THE INVENTION

The present invention aims to provide a DC capacitor degradation alarm circuit to overcome the problems of the conventional capacitor detection method of power supply systems that detect capacitor degradation by measuring and recording regularly and manually, and cannot automatically perform online detection and alarm capacitor degradation during operation of the power supply systems.

The DC capacitor degradation alarm circuit according to the present invention includes two filter circuits and a degradation detection element. The two filter circuits receive a rectified voltage and perform filtering. The two filter circuits are coupled in parallel, and each of the filter circuits includes a plurality of capacitor modules coupled in series. The capacitor module can be a single capacitor or includes a plurality of capacitors coupled in series or in parallel to allow users to arrange construction thereof to receive required capacitance. The degradation detection element electrically bridges the two filter circuits with connection nodes located between the capacitor modules to detect a voltage difference value of the two filter circuits and perform operation by incorporating with total output voltage to provide detection information of voltage difference value percentage of the filter circuits.

The invention provides an improved capacitor degradation detection method over the conventional one by using the degradation detection element to detect the voltage difference value (Vd) of the two filter circuits and work out the percentage (Vd/Vout) through total output voltage (Vout) to be compared with a preset value to determine degradation conditions. In the event that the obtained percentage value exceeds the preset value, the degradation detection element generates an alarm signal through a buzzer or an alarm light signal to alert users about the degradation of the capacitor modules, so that expensive energy storage device can be protected from the risk of degradation.

The DC capacitor degradation alarm circuit of the present invention can detect the capacitance online through the degradation detection element while a power supply system is in operation. During switching of the charging modes of the power supply system, the detection results are not affected by the alteration of charging voltage, hence the invention is an automatic online capacitor degradation detection circuit.

The DC capacitor degradation alarm circuit thus formed provides many benefits, notably:

1. The invention can automatically detect capacitor degradation condition without affecting load apparatus while a power supply system is in operation.
2. The invention can instantly issue an alarm signal to alert users to detect capacitor degradation condition or perform replacement when capacitor degradation is detected.
3. The invention can prevent false alarm caused by voltage difference generated during switching of the charging modes of the power supply systems.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 1:
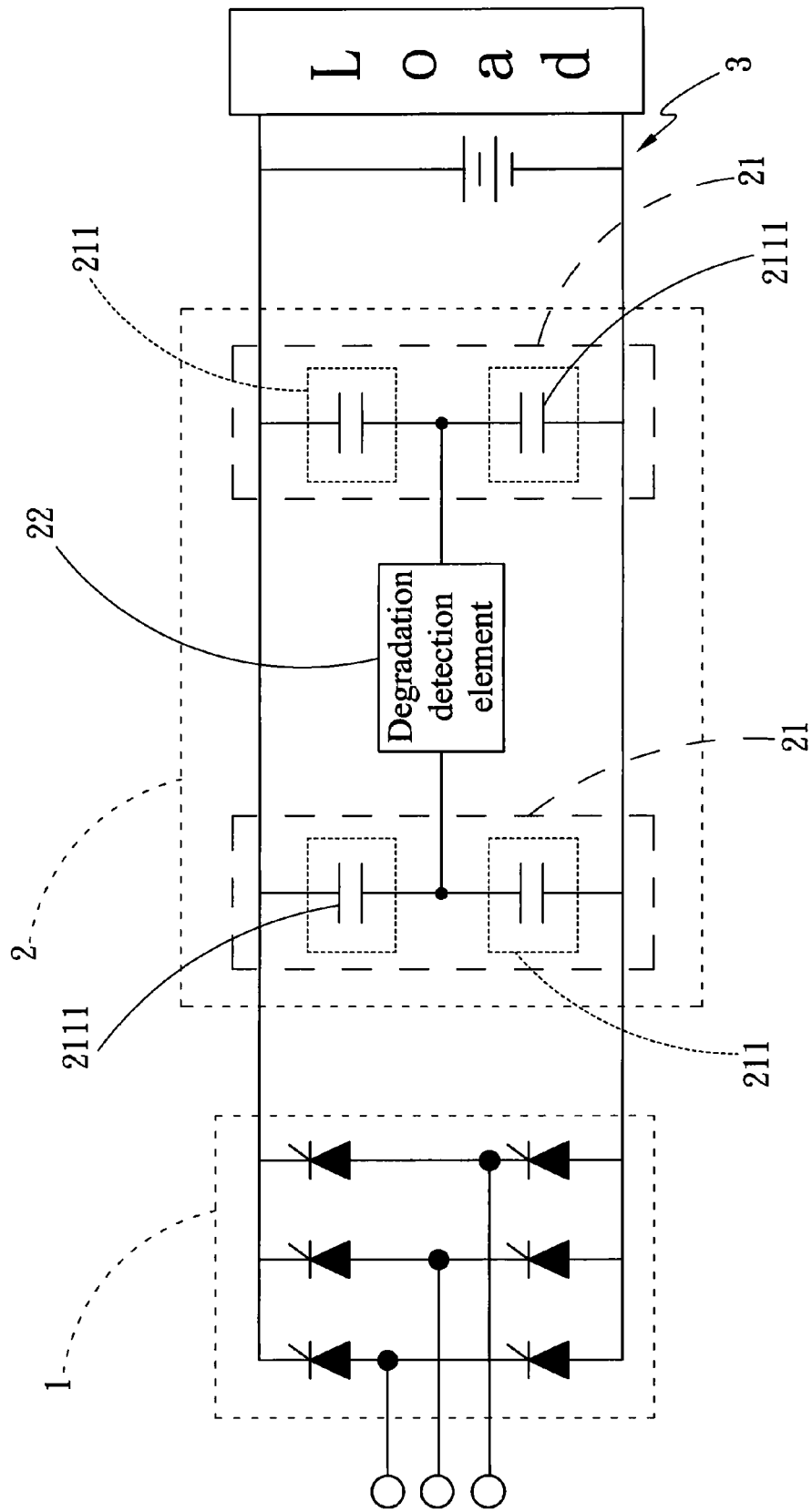
FIG. 1 is a circuit diagram of the DC capacitor degradation alarm circuit of the invention.
Figure 6:
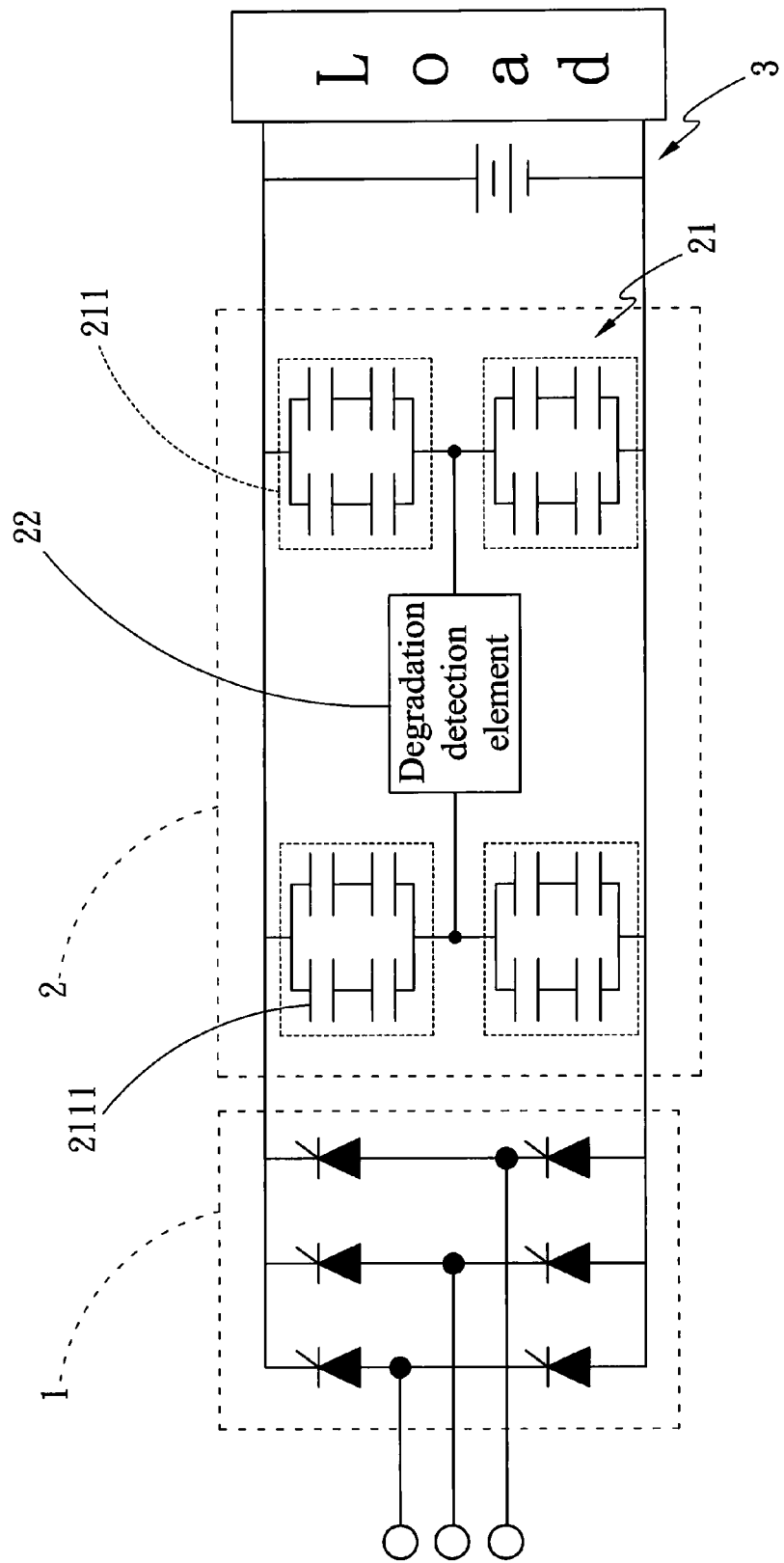
FIG. 6 is a schematic view showing a capacitor module including a plurality of capacitors coupled in series and in parallel according to the invention.

Please refer to FIG. 1, the DC capacitor degradation alarm circuit according to the invention includes:

a rectification circuit 1 to provide a rectified voltage to perform filtering and energy storage functions;

a capacitor degradation detection device 2 which receives the rectified voltage from the rectification circuit 1 to perform detection and includes two filter circuits 21 and at least one degradation detection element 22. The filter circuits 21 receive the rectified voltage and perform filtering, and are coupled in parallel. Each filter circuit 21 includes a plurality of capacitor modules 211 coupled in series. Each capacitor module 211 can be a single capacitor 2111 or includes a plurality of capacitors 2111 coupled in series or in parallel to allow users to arrange construction thereof to receive required capacitance (also referring to FIG. 6). The degradation detection element 22 electrically bridges the two filter circuits 21 with connection nodes located between the two capacitor modules 211 to detect a voltage difference value of the two filter circuit 21 and perform operation by incorporating with total output voltage to provide detection information of the filter circuits 21; and an energy storage device 3 to receive the rectified voltage from the filter circuits 211 to store energy.

Referring to FIG. 1, the invention aims to detect degradation degree of the capacitor 2111 of the capacitor module 211 in a DC power supply system. Its operation includes: the filter circuits 21 receive the rectified voltage provided by the rectification circuit 1; and the capacitor modules 211 perform filtering and store the rectified voltage in the energy storage device 3.

Figure 2:
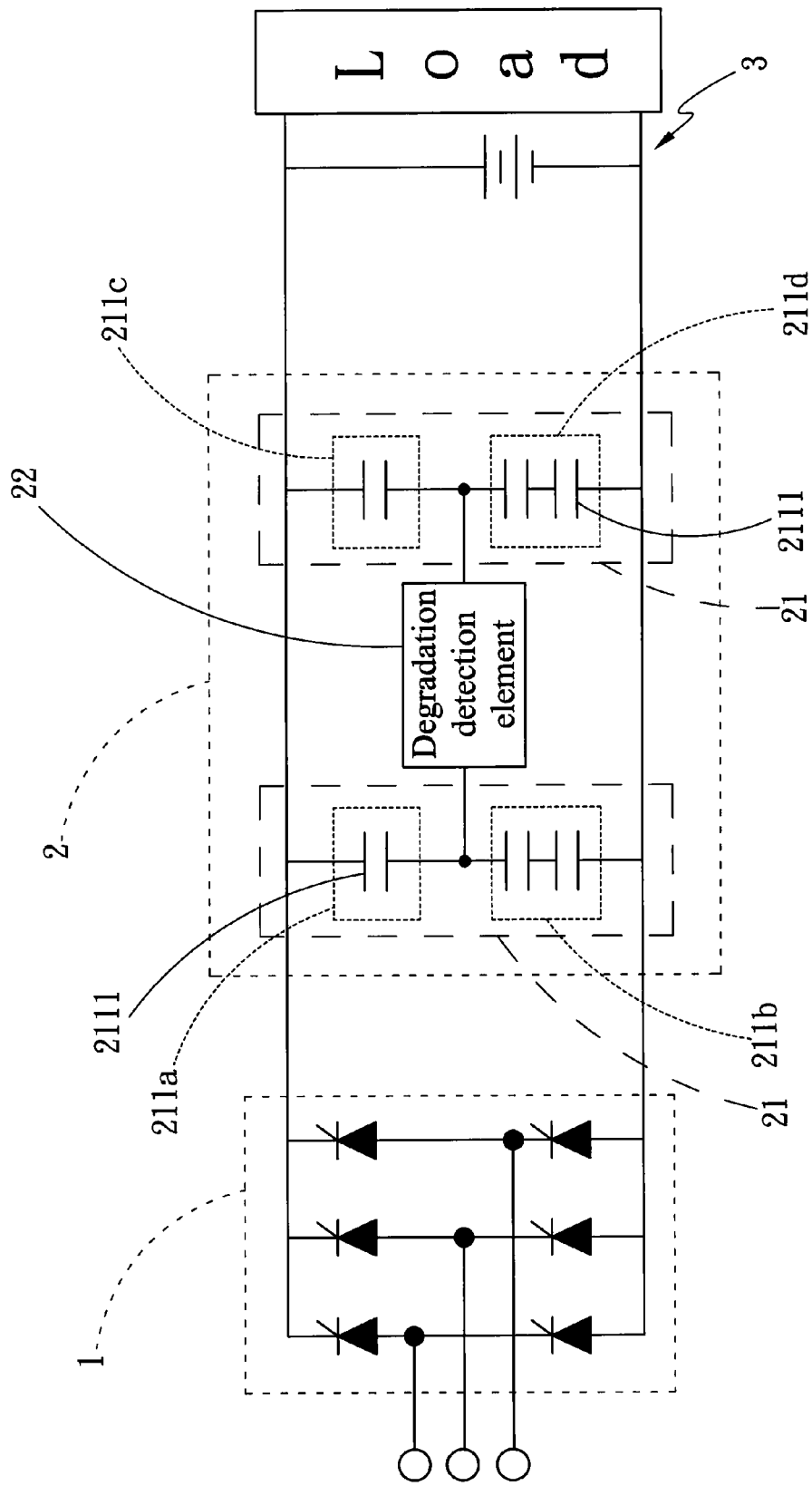
FIG. 2 is a circuit diagram of an embodiment of the invention.

Refer to FIG. 2 for an embodiment of the invention. One filter circuit 21 is coupled in series with a first capacitor module 211*a* and a second capacitor module 211*b*. The first capacitor module 211*a* has capacitance C1, and the second capacitor module 211*b* has capacitance C2. Another filter circuit 21 is coupled in series with a third capacitor module 211*c* and a fourth capacitor module 211*d*, and the third capacitor module 211*c* has capacitance C3 and the fourth capacitor module 211*d* has capacitance C4. The degradation detection element 22 electrically bridges a connection node between the first capacitor module 211*a* and second capacitor module 211*b* and another connection node between the third capacitor module 211*c* and fourth capacitor module 211*d* to detect voltage value V1

$$\left(V1 = Vout \times \frac{C1}{C1+C2}, \text{where } Vout \text{ is total output voltage}\right)$$

between the first capacitor module 211*a* and second capacitor module 211*b* and voltage value V2

$$\left(V2 = Vout \times \frac{C3}{C3+C4}\right)$$

between the third capacitor module 211*c* and fourth capacitor module 211*d*. Through the voltage values V1 and V2, a voltage difference value Vd (Vd=V1−V2) can be derived; then the percentage $$\left(\frac{Vd}{Vout} = \frac{C1}{C1+C2} - \frac{C3}{C3+C4}\right)$$

of the voltage difference value Vd and total output voltage Vout can be calculated to be compared with a preset value to judge degradation conditions. Through the aforesaid percentage $$\left(\frac{Vd}{Vout}\right),$$

it is realized that detection result is not affected by alteration of the total output voltage Vout. For instance, voltage fluctuation of commercial power supply, or floating charge and fast charge of the energy storage device 3 could cause variations of the total output voltage Vout.

Also referring to FIG. 1, the percentage $$\left(\frac{Vd}{Vout}\right)$$

of the voltage difference value received by the degradation detection element 22 can be set according to user's requirements. In the event that capacitance degradation of the capacitor module 211 takes place, the voltage difference value is generated; if the voltage difference value percentage exceeds user's setting, the degradation detection element 22 issues an alarm signal through a buzzer or an alarm light signal to alert the user, or continuously displays the voltage difference value through a voltage difference value display for user recording and detecting. The degradation detection element 22 also can send the generated detection information to a remote computer for recording to allow users to record degradation degree and degradation trend information of the capacitor module 211 to prevent the expensive energy storage device 3 from being affected by the degradation.

Figure 3:
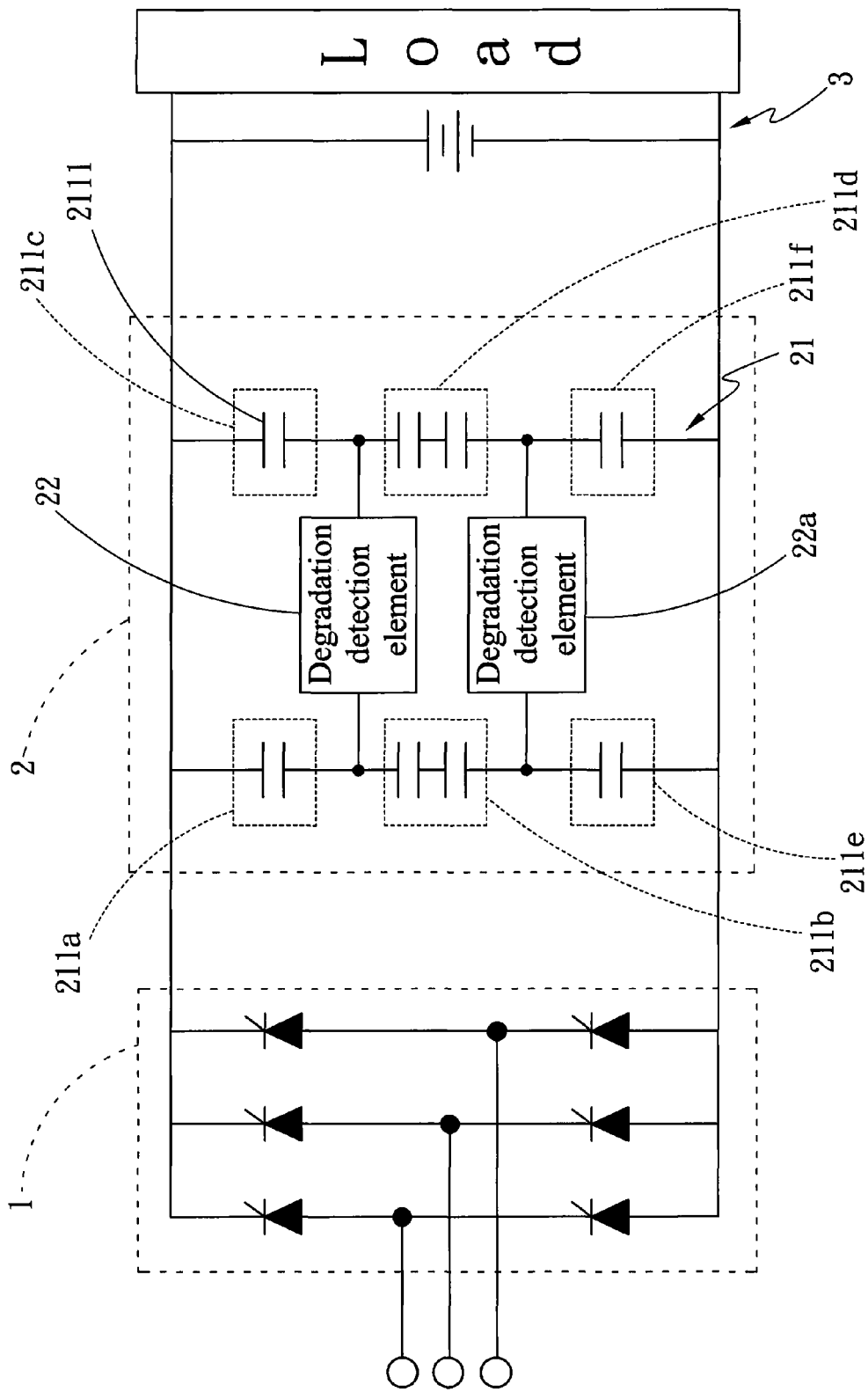
FIG. 3 is another circuit diagram of an embodiment of the invention.

Refer to FIG. 3 for a variation of the aforesaid embodiment, the second capacitor module 211*b* is further coupled in series with a fifth capacitor module 211*e* having capacitance C5, the fourth capacitor module 211*d* is coupled in series with a sixth capacitor module 211*f* having capacitance C6, and the second capacitor module 211*b* and fifth capacitor module 211*e* bridged by a second degradation detection element 22*a* which also electrically bridges the fourth capacitor module 221*d* and sixth capacitor module 211*f*. The second detection element 22*a* detects a voltage value V3

$$\left(V3 = Vout \times \frac{C1+C2}{C1+C2+C5}\right)$$

on the side of the fifth capacitor module 211*e*, and another voltage value V4

$$\left(V4 = Vout \times \frac{C3+C4}{C3+C4+C6}\right)$$

on the side of the sixth capacitor module 211*f*. Through voltage value V3 and V4, a voltage difference value Vd2 (Vd2=V3−V4) can be obtained. By incorporating the voltage difference value Vd2 with the total output voltage Vout, a voltage difference value percentage $$\left(\frac{Vd2}{Vout}\right)$$

can be calculated and derived to detect whether the capacitor modules 211 have degradation conditions.

Figure 4:
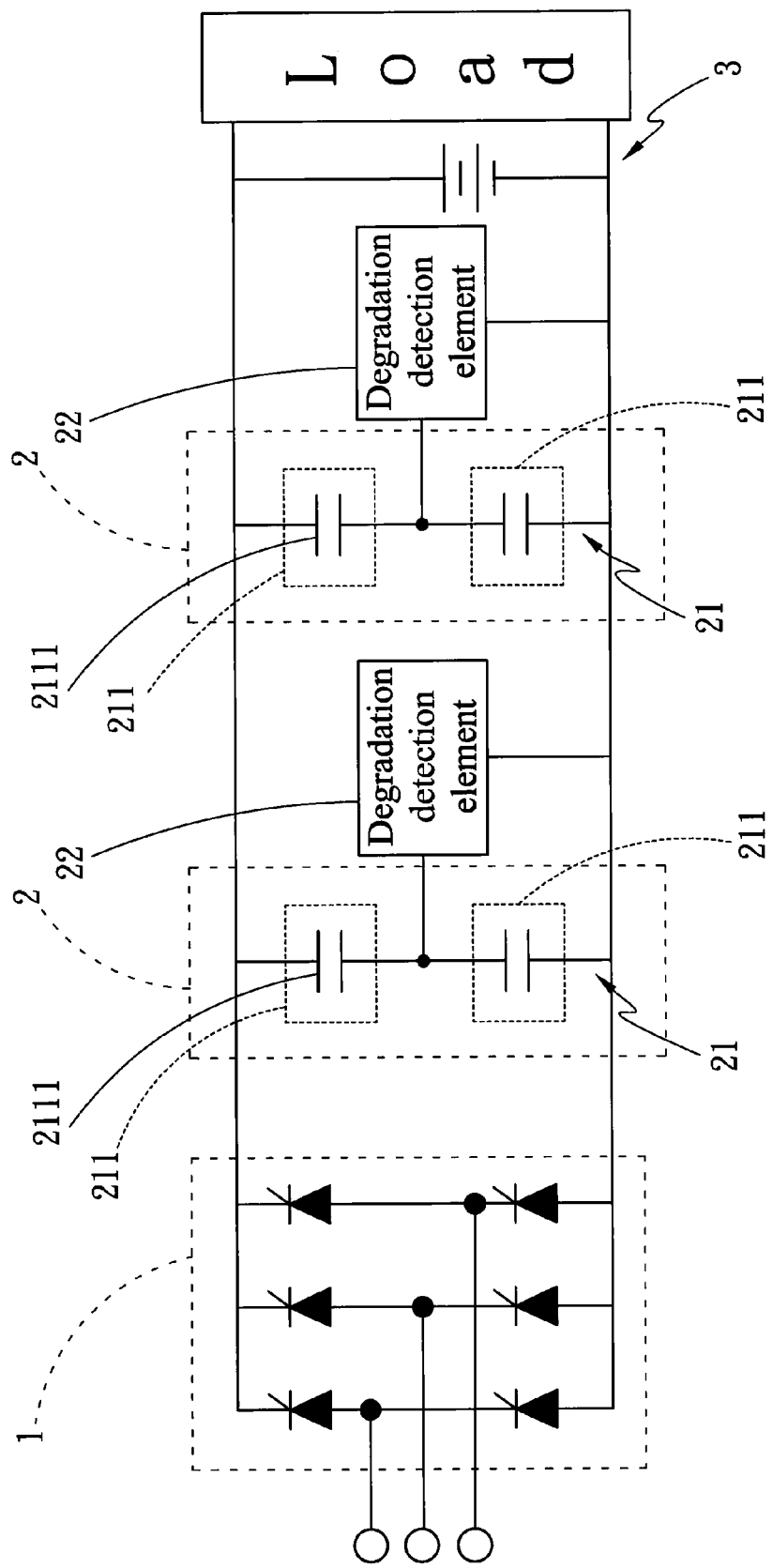
FIG. 4 is a circuit diagram of another embodiment of the invention.

Refer to FIG. 4 for another embodiment of the invention. The capacitor degradation detection device 2 includes one filter circuit 21 and two capacitor modules 211 coupled in series. The two capacitor modules 211 are electrically bridged by one degradation detection element 22. The two capacitor modules 211 have respectively capacitance C1' and C2'. The degradation detection element 22 can detect a voltage division value Vp $$\left(Vp = Vout \times \frac{C1'}{C1' + C2'}\right)$$

to be incorporated with the total output voltage Vout to calculate and derive a voltage division value percentage $$\left(\frac{Vp}{Vout}\right);$$

if the voltage division value percentage exceeds user's preset value, an alarm signal is automatically issued.

Figure 5:
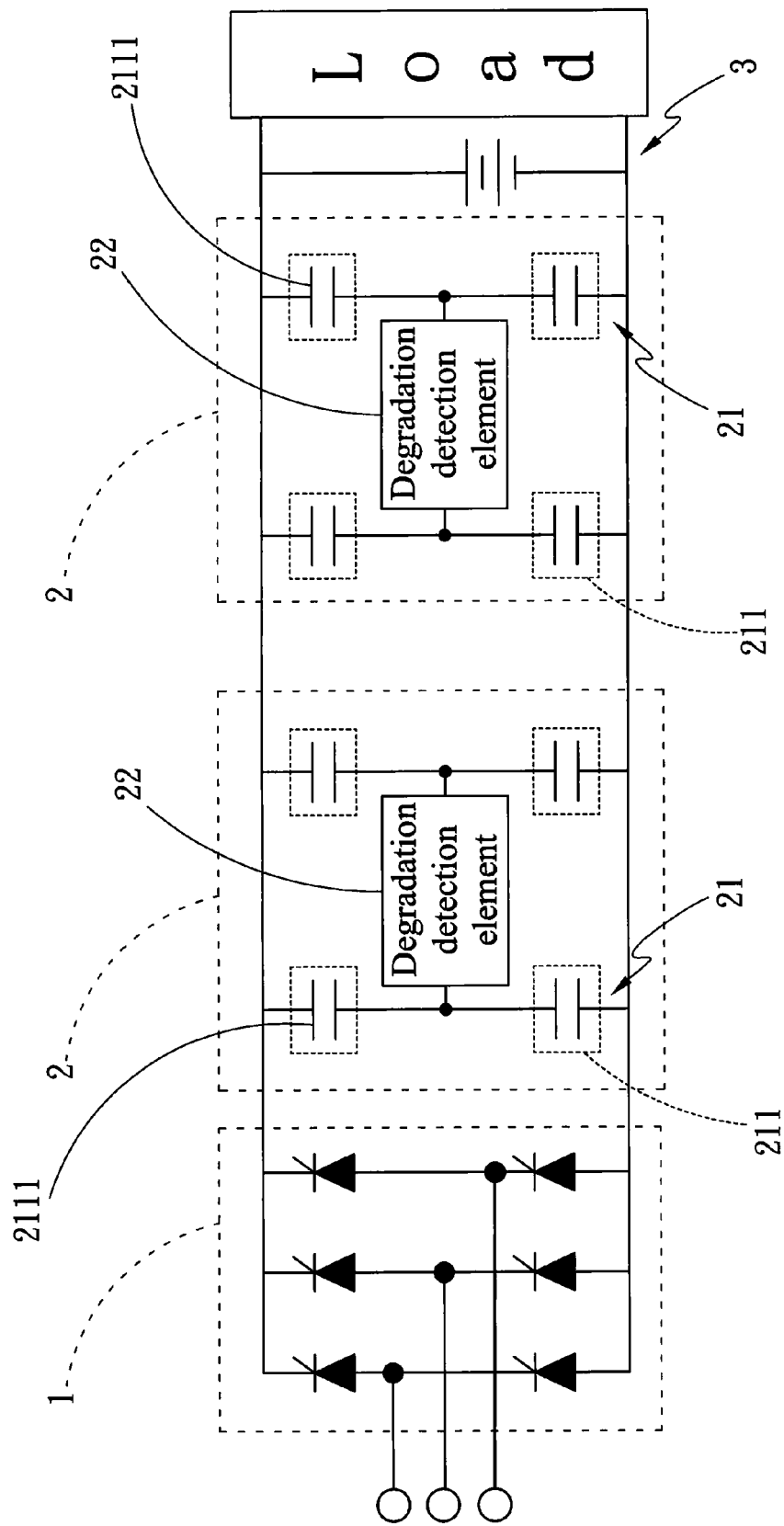
FIG. 5 is a circuit diagram showing multiple capacitor degradation detection devices coupled together according to the invention.

Referring to FIGS. 4 and 5, multiple sets of the capacitor degradation detection devices 2 of the invention can be coupled together between the rectification circuit 1 and energy storage device 3 to increase capacitance while each providing individual detection function. The degradation detection element 22 of each set can detect degradation degree of the capacitor module 211 to facilitate following maintenance process and degradation tracking and recording.

What is claimed is:

1. A DC (direct current) capacitor degradation alarm circuit, comprising:
   a rectification circuit;
   a load driven by a DC power rectified by the rectification circuit; and
   at least one capacitor degradation detection device connected between the rectification circuit and the load, wherein the capacitor degradation detection device includes:
      two filter circuits, which receive a rectified voltage from the rectification circuit to perform a filtering operation, coupled in parallel, wherein each of the two filter circuits includes a plurality of capacitor modules coupled in series, wherein any two of the plurality of capacitor modules are connected at a node; and
      at least one degradation detection element, which has two ends connected to the nodes of the two filter circuits and detects two voltages at the nodes of the two filter circuits operating to get a voltage difference to determine whether the capacitor modules degrade.

2. The DC capacitor degradation alarm circuit of claim 1, wherein the capacitor modules coupled in series of the two filter circuits include the same quantity.

3. The DC capacitor degradation alarm circuit of claim 1, wherein each capacitor module is a single capacitor.

4. The DC capacitor degradation alarm circuit of claim 1, wherein each capacitor module includes a plurality of capacitors coupled in series.

5. The DC capacitor degradation alarm circuit of claim 1, wherein each capacitor module includes a plurality of capacitors coupled in parallel.

* * * * *